United States Patent [19]

Matsuda et al.

[11] Patent Number: 4,684,592

[45] Date of Patent: Aug. 4, 1987

[54] STIMULABLE PHOSPHOR SHEET

[75] Inventors: Terumi Matsuda; Kaoru Tamura, both of Kaisei, Japan

[73] Assignee: Fuji Photo Film Co., Ltd., Japan

[21] Appl. No.: 720,882

[22] Filed: Apr. 8, 1985

[30] Foreign Application Priority Data

Apr. 6, 1984 [JP] Japan ................................ 59-69589
Apr. 6, 1984 [JP] Japan ................................ 59-69590
Apr. 6, 1984 [JP] Japan ................................ 59-69591

[51] Int. Cl.[4] ......................... G03F 9/00; G03C 5/16; G01T 1/11; G09K 11/08

[52] U.S. Cl. ........................................ 430/6; 430/139; 250/337; 250/484.1; 252/301.4 R; 252/301.6 R

[58] Field of Search .................... 430/6, 139; 250/337, 250/484; 252/301.4 R, 301.6 R

[56] References Cited

U.S. PATENT DOCUMENTS 2,887,379 5/1959 Blake et al. ........................ 430/139
3,617,285 11/1971 Staudenmayer ........................ 430/6
4,350,893 9/1982 Takahashi et al. .............. 250/327.2
4,368,390 1/1983 Takahashi et al. .............. 250/484.1
4,394,581 7/1983 Takahashi et al. .............. 250/327.2
4,510,388 4/1985 Yamazaki et al. .............. 250/484.1
4,511,802 4/1985 Teraoka .......................... 250/484.1

*Primary Examiner*—John L. Goodrow
*Assistant Examiner*—Patrick J. Ryan
*Attorney, Agent, or Firm*—Gerald J. Ferguson, Jr.; Ronni S. Malamud; Michael P. Hoffman

[57] ABSTRACT

A stimulable phosphor sheet comprising a support, a phosphor layer containing a stimulable phosphor and a binder, and a protective film superposed in this order, which is characterized in that at least one of the front end and the rear end of the phosphor layer along the direction to be conveyed are retracted from the corresponding end of the support, and said retracted end of the phosphor layer and support is protected by a polymer coating layer, a polymer film or a solid material.

10 Claims, 9 Drawing Figures

STIMULABLE PHOSPHOR SHEET

BACKGROUND OF THE INVENTION

1. Field of the Invention

The present invention relates to a stimulable phosphor sheet employable in a radiation image recording and reproducing method utilizing a stimulable phosphor.

2. Description of Prior Arts

For obtaining a radiation image, there has been conventionally employed a radiography utilizing a combination of a radiographic film having a sensitive silver salt material layer and an intensifying screen.

As a method replacing the above-mentioned conventional radiography, a radiation image recording and reproducing method utilizing a stimulable phosphor as described, for instance, in U.S. Pat. No. 4,239,968, has been developed and paid much attention. The method involves steps of causing a stimulable phosphor to absorb a radiation having passed through an object or having radiated from an object; sequentially exciting (or scanning) the phosphor with an electromagnetic wave such as visible light or infrared rays (stimulating rays) to release the radiation energy stored in the phosphor as light emission (stimulated emission); photoelectrically detecting the emitted light to obtain electric signals; and reproducing the radiation image of the object as a visible image, numerals, symbols, etc. from the electric signals.

In the radiation image recording and reproducing method, a radiation image is obtainable with a sufficient amount of information by applying a radiation to the object at a considerably smaller dose, as compared with the conventional radiography. Accordingly, the radiation image recording and reproducing method is of great value, especially when the method is used for medical diagnosis.

In performing the radiation image recording and reproducing method, a stimulable phosphor is generally employed in the form of a stimulable phosphor sheet (also referred to as a radiation image storage panel, and generally in the form of a sheet of rectangle, square, etc.) which comprises a support and a phosphor layer provided thereon. The phosphor layer comprises a stimulable phosphor and a binder. Further, a protective film made of a transparent plastic film is provided on a surface of the phosphor layer to protect the phosphor layer from physical and chemical deterioration.

The stimulable phosphor sheet does not serve to finally record image information, but only stores the information temporarily to provide the image or the like on an independently prepared final recording medium as described above. Accordingly, the stimulable phosphor sheet can be repeatedly used and such repeated use brings about economical advantage.

The repeated use of the stimulable phosphor sheet is particularly advantageous, for instance, in the case that a radiation image information recording and reading device employing the stimulable phosphor sheet is mounted on a traveling station such as a radiographic apparatuscarryig car to conduct mass radiographic examination in various places. More in detail, it is inconvenient to carry a great number of stimulable phosphor sheets on a traveling station, and there is a limitation on the number of sheets capable of being carried on a car such as a radiographic apparatus-carrying car. Accordingly, it is practically useful that the stimulable phosphor sheets are mounted on a radiographic apparatus-carrying car under such conditions that the stimulable phosphor sheets are repeatedly used; radiation image information of an object is recorded on each stimulable phosphor sheet and read out to obtain image information as a signal; and the obtained signal is transferred to a recording medium having a great recording capacity such as a magnetic tape so as to repeatedly use the stimulable phosphor sheet in cycle. This means that radiation images of a number of objects can be obtained by the use of a small number of stimulable phosphor sheets. Further, the combination of the repeated uses of the stimulable phosphor sheets with a continuous radiographic process enables to perform rapid radiography in the mass radiographic examinations. This combination is of great value in practical use.

In the case of performing repeated uses of the stimulable phosphor sheets in cycle, after the radiation energy stored in the stimulable phosphor sheet is read out and aimed image information is obtained, the remaining energy in the sheet is released and erased in a manner as disclosed, for instance, in Japanese Patent Provisional Publications Nos. 56(1981)-11392 and 56(1981)12599. By employing such manner, the stimulable phosphor sheet can be efficiently and repeatedly used in cycle.

Thus, the radiation image information recording and reading device, in one aspect, is desirably mounted on a traveling station such as a radiographic apparatus-carrying car in the form of a united built-in device which comprises an image recording means for exposing a stimulable phosphor sheet to a radiation having passed through an object so as to record and store a radiation image in the stimulable phosphor sheet, a read-out means for reading out the radiation image stored in the stimulable phosphor sheet, an erasure means for releasing and erasing radiation energy remaining in the stimulable phosphor sheet for the next use of the stimulable phosphor sheet, and a conveyance means for moving the stimulable phosphor sheet in cycle to each of the above-mentioned means. The radiation image information recording and reading device having the above-mentioned constitution have various advantages not only in mounting in the traveling station such as a radiographic apparatus-carrying car but also in setting in hospitals, so that the above device is convenient in practical use.

It is, however, a problem that if a stimulable phosphor sheet has physical deterioration such as a scratch on a surface thereof (a phosphor layer-side surface of the sheet), the quality of image or the accuracy of image information provided by the phorphor sheet tends to decrease markedly. For this reason, it is necessary to select the means for conveying a stimulable phosphor sheet with such a careful consideration that the surface of the stimulable phosphor sheet is not damaged. From this viewpoint, as a means for conveying a stimulable phosphor sheet, a belt conveyor made of a soft sheet-material is generally employed.

Even in the case of using a belt-conveyor, however, the front end of the stimulable phosphor sheet sometimes collides with several members, in the course of running across the clearance of two belt-conveyor, or moving onto the belt-conveyor from various means such as the image-recording means, read-out means, erasure means, and an optionally arranged stimulable phosphor sheet-storing means, or vice versa. These collision may cause physical deterioration of the phosphor layer of the stimulable phosphor sheet. It has been proposed that the front end of the phosphor layer be retracted from the corresponding end of the support. However, a further improvement is required. Particularly, in the case that the stimulable phosphor sheet is employed in the aforementioned radiation image recording and reproducing device utilizing the stimulable phosphor sheet repeatedly in cycle, the phosphor sheet is repeatedly conveyed in the device and therefore the physical deterioration rapidly occurs in the stimulable phosphor sheet.

SUMMARY OF THE INVENTION

The stimulable phosphor sheet of the present invention comprises, in one aspect, a support, a phosphor layer containing a stimulable phosphor and a binder, and a protective film superposed in this order, which is characterized in that at least one of the front end and the rear end of the phosphor layer along the direction to be conveyed are retracted from the corresponding end of the support, and said retracted end of the phosphor layer and support is protected by a polymer coating layer or a polymer film.

The stimulable phosphor sheet of the invention, in another aspect, comprises a support, a phosphor layer containing a stimulable phosphor and a binder, and a protective film superposed in this order, which is characterized in that at least one of the front end and the rear end of the phosphor layer along the direction to be conveyed is retracted from the corresponding end of the support, and said retracted end of the phosphor layer is protected by a solid material fixedly placed in the area formed by the retraction of the end of the phosphor layer.

The stimulate phosphor sheet of the invention, in other aspect, comprises a substrate, a support, a phosphor layer containing a stimulable phosphor and a binder, and a protective film superposed in this order, which is characterized in that at least one of the front end and the rear end of the phosphor layer and support along the direction to be conveyed is retracted from the corresponding end of the substrate, and said end of the sheet is protected by a polymer coating layer or a polymer film.

The stimulable phosphor sheet of the invention, in other aspect, comprises a substrate, a support, a phosphor layer containing a stimulable phosphor and a binder, and a protective film superposed in this order, which is characterized in that at least one of the front end and the rear end of the phosphor layer and support along the direction to be conveyed are retracted from the corresponding end of the substrate, and said retracted end of the phosphor layer and support are protected by a solid material fixedly placed in the area formed by the retraction of the phosphor layer.

The stimulate phosphor sheet of the invention may be protected at the rear end, because the stimulable phosphor sheet can move forward and back in certain devices. Accordingly, both of the front end and rear end are preferably protected in the present invention.

DETAILED DESCRIPTION OF THE INVENTION

Figure 1A:
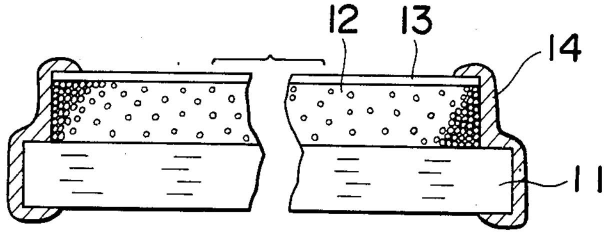
FIGS. 1*a*, 1*b*, 1*c* and 1*d* are schematic views illustrating the constitutions of embodiments of the stimulable phosphor sheet of the present invention.

The present invention will be described more in detail hereinafter referring to the accompanying drawings.

The general constitution of the conventional stimulable phosphor sheet which is an object of the conveyance in the present invention is well known. The stimulable phosphor sheet is generally employed, as described above, in the form of a sheet comprising a support and a phosphor layer provided thereon which comprises a stimulable phosphor and a binder. On the surface of the phosphor layer is provided a protective film of a transparent plastic material, because the phosphor layer is easily affected by physical shocks.

FIGS. 1*a*, 1*b*, 1*c*, and 1*d* schematically illustrate the constitutions of embodiments of the stimulable phosphor sheet of the invention.

In these figures, the stimulable phosphor sheet comprises a support 11, a phosphor layer 12 and a protective film 13.

Examples of the support material include plastic films such as films of cellulose acetate and polyethylene terephthalate, metal sheets such as aluminum foil, ordinary papers, baryta paper, and resin-coated papers. On the surface of the support (phosphor layer-side surface of the support) may be provided other functional layers such as an adhesive layer, a light-reflecting layer and a light-absorbing layer.

The phosphor layer essentially comprises stimulable phosphor particles dispersed in a binder. A great number of stimulable phosphors are known. The stimulable phosphor employed in the invention can be selected from the known stimulable phosphors. Examples of the known stimulable phosphors include a divalent europium activated alkaline earth metal fluorohalide phosphor ($M^{II}FX:Eu^{2+}$, in which $M^{II}$ is at least one alkaline earth metal selected from the group consisting of Mg, Ca and Ba; and X is at least one halogen selected from the group consisting of Cl, Br, and I); an europium and samarium activated strontium sulfide phosphor (SrS:Eu,Sm); an europium and samarium activated lanthanum oxysulfide phosphor ($La_2O_2S$:Eu,Sm); an europium activated barium aluminate phosphor ($BaO.Al_2O_3$:Eu); an europium activated alkaline earth metal silicate phosphor ($M^{2+}O.SiO_2$:Eu, in which $M^{2+}$ is at least one alkaline earth metal selected from the group consisting of Mg, Ca and Ba); a cerium activated rare earth oxyhalide phosphor (LnOX:Ce, in which Ln is at least one rare earth element selected from the group consisting of La, Y, Gd and Lu; and X is at least one halogen selected from the group consisting of Cl, Br and I) and the like.

A transparent protective film is then provided on the surface of the phosphor layer to physically and chemically protect the phosphor layer. Examples of the material employable for the preparation of the transparent protective film include cellulose acetate, polymethyl methacrylate, polyethylene terephthalate and polyethylene. The transparent protective film generally has a thickness within the range of approx. 0.1–20 μm.

The stimulable phosphor sheet can be colored with an appropriate coolant as described in U.S. Pat. No. 4,394,581 and U.S. patent application Ser. No. 326,642.

Further, white powder may be dispersed in the phosphor layer as described in U.S. Pat. No. 4,350,893.

According to the present invention, at least one of the front end and the rear end of the stimulable phosphor sheet is processed to have enhanced protection against the physical (mechanical) shock given to the end by the collision with other materials and members, as well as enhanced protection against chemical deterioration.

Figure 1B:
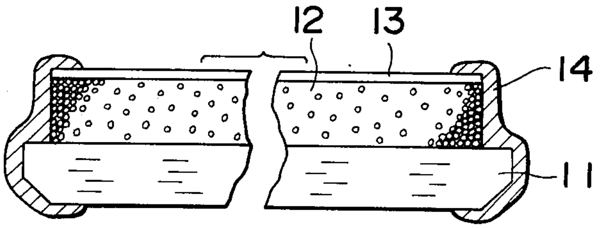

In one aspect, the front and/or rear end of the phosphor layer along the direction to be conveyed is retracted from the corresponding end of the support, and said end of the phosphor layer and support is protected by a polymer coating layer, as illustrated in FIG. 1*a* in which the support, phosphor layer, protective layer and polymer coating layer are indicated by 11, 12, 13 and 14, respectively. The edge on the bottom surface of the end of the support can be chamferred, as illustrated in FIG. 1*b*.

Figure 1C:
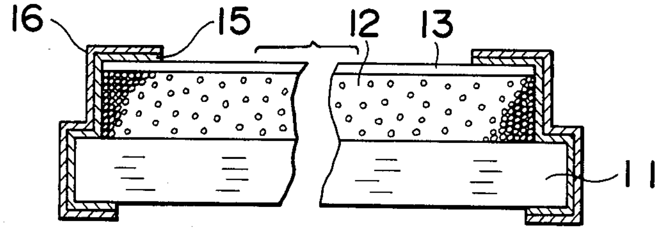
Figure 1D:
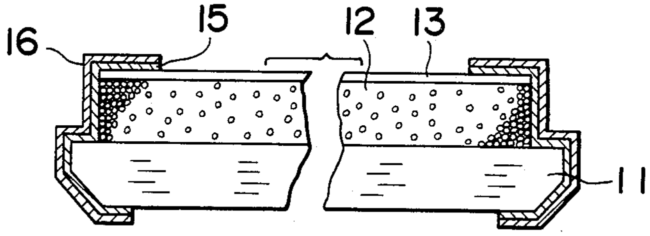

In another aspect, the front and/or rear end of the phosphor layer along the direction to be conveyed is retracted from the corresponding end of the support, and said end of the phosphor layer and support are protected by a polymer film, as illustrated in FIG. 1*c* in which the support, phosphor layer, protective layer and polymer film are indicated by 11, 12, 13 and 16, respectively. The polymer film 16 is fixed to the end by an adhesive layer 15. The edge on the bottom surface of the end of the support can be chamferred, as illustrated in FIG. 1*d*.

Figure 2A:
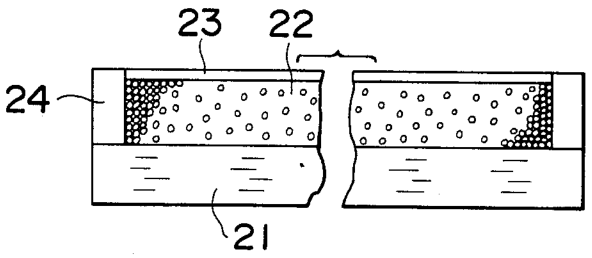
FIGS. 2*a* and 2*b* are schematic views illustrating the constitutions of embodiments of the stimulable phosphor sheet of the invention.
Figure 2B:
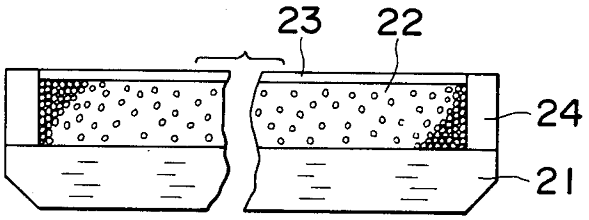

In other aspect, the front and/or rear end of the phosphor layer along the direction to be conveyed is retracted from the corresponding end of the support, and said retracted end of the phosphor layer is protected by a solid material fixedly placed in the area formed by the retraction of the phosphor layer, as illustrated in FIG. 2*a* in which the support, phosphor layer, protective layer and solid material are indicated by 21, 22, 23 and 24, respectively. The edge on the bottom surface of the end of the support can be chamferred, as illustrated in FIG. 2*b*.

Figure 3A:
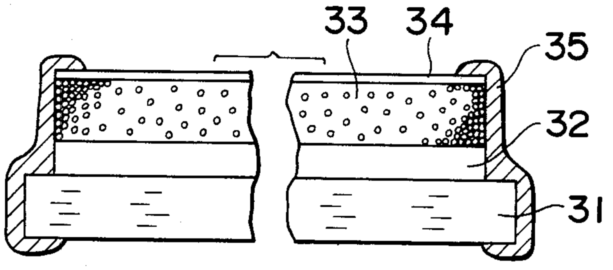
FIGS. 3*a*, 3*b* and 3*c* are schematic views illustrating the constitutions of embodiments of the stimulable phosphor sheet of the invention.
Figure 3B:
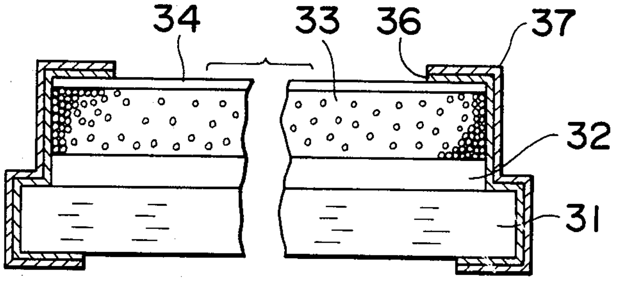
Figure 3C:
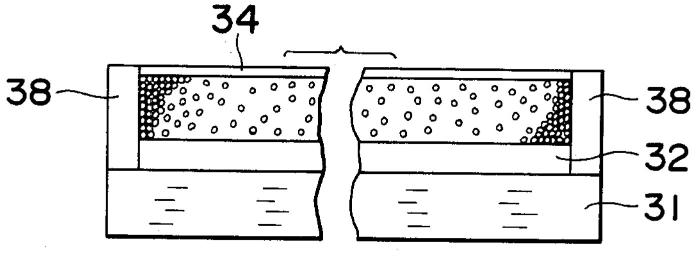

In other aspect, a stimulable phosphor sheet may comprise a substrate, a support, a phosphor layer and a protective film superposed in this order, in which the front and/or rear end of the phosphor layer and support along the direction to be conveyed is retracted from the corresponding end of the substrate, and said end of the sheet is protected by a polymer coating layer. This embodiment is illustrated in FIG. 3*a*, in which the substrate, support, phosphor layer, protective layer and polymer coating layer are indicated by 31, 32, 33, 34, and 35, respectively. The protection can be made by means of an adhesive layer 36 and a polymer film 37, as illustrated in FIG. 3*b*. The protection can be made by means of a solid material 38, as illustrated in FIG. 3*c*.

There is no specific limitation on the material of the substrate. For instance, the substrate can be produced from any material employable for the production of the support.

The above-described protections can be given to the front and/or rear end of the stimulable phosphor sheets, to protect the phosphor layer against physical shocks, as well as to keep the phosphor layer from chemical deterioration. The front and/or rear end can be chamferred on the bottom surface.

In the above-described embodiments, the end of the protruded support or substrate can effectively keep the phosphor layer from physical shock, friction, and the like applied to the end of the stimulable phosphor sheet.

The polymer coating layer can be provided to the end of the stimulable phosphor sheet, for instance, by applying a solution of a film-forming polymer in a solvent to the end and then drying to remove the solvent, or applying reactive material(s) to form a polymer material to the end and causing the reaction to form in-situ the polymer coating film. There is no specific limitation on the film-forming polymer employed in the above process. For instance, a polyurethane-acrylic resin and a mixture of an acrylic resin and vinyl chloride-vinyl acetate copolymer (which is disclosed in Japanese Patent Provisional Publication No. 58(1983)-68746) can be used.

The polymer film can be produced from the same material as that employed for the production of the protective material. For instance, cellulose acetate, polymethyl methacrylate, polyethylene terephthalate, and polyethylene can be mentioned. The polymer film employed for this purpose may be transparent or not. The film can be fixed to the end, for instance, by an adhesive or other sticky material.

There is no specific limitation on the solid material to be arranged adjacent to the retracted end of the phosphor layer. For instance, a solid polymer material and a metal can be employed. The solid polymer material can be that mentioned hereinbefore as the material for production of the surface protective film or a polymer film for protection of the end. The solid material can be provided adjacent to the end of the retracted phosphor layer by placing it. Otherwise, a polymer material solution can be introduced in the area and the solid polymer can be formed in-situ after removal of the solvent. Otherwise, a solid polymer material can be formed in-situ by a reaction of reactive compound(s). The solid material can be fixed to the end of the retracted phosphor layer and/or the upper surface of the support or substrate.

We claim:

1. A stimulable phosphor sheet comprising a support, a phosphor layer containing a stimulable phosphor and a binder, and a protective film superposed in this order, which is characterized in that at least one of the front end and the rear end of the phosphor layer along the direction to be conveyed are retracted from the corresponding end of the support, and said retracted end of the phosphor layer and support is protected by a polymer coating layer or a polymer film.

2. The stimulable phosphor sheet as claimed in claim 1, wherein the front and rear ends are both protected by a polymer coating layer or a polymer film.

3. A stimulable phosphor sheet comprising a support, a phosphor layer containing a stimulable phosphor and a binder, and a protective film superposed in this order, which is characterized in that at least one of the front end and the rear end of the phosphor layer along the direction to be conveyed is retracted from the corresponding end of the support, and said retracted end of the phosphor layer is protected by a solid material fixedly placed in the area formed by the retraction of the end of the phosphor layer.

4. The stimulable phosphor sheet as claimed in claim 3, wherein the solid material is a polymer material.

5. The stimulable phosphor sheet as claimed in claim 3 or 4, wherein both sides of the stimulable phosphor sheet are protected by a polymer coating layer or a polymer film.

6. A stimulable phosphor sheet comprising a substrate, a support, a phosphor layer containing a stimulable phosphor and a binder, and a protective film superposed in this order, which is characterized in that at least one of the front end and the rear end of the phosphor layer and support along the direction to be conveyed is retracted from the corresponding end of the substrate, and said end of the sheet are protected by a polymer coating layer or a polymer film.

7. The stimulable phosphor sheet as claimed in claim 6, wherein both sides of the stimulable phosphor sheet are protected by a polymer coating layer on a polymer film.

8. A stimulable phosphor sheet comprising a substrate, a support, a phosphor layer containing a stimulable phosphor and a binder, and a protective film superposed in this order, which is characterized in that at least one of the front end and the rear end of the phosphor layer and support along the direction to be conveyed are retracted from the corresponding end of the substrate, and said retracted end of the phosphor layer and support are protected by a solid material fixedly placed in the area formed by the retraction of the phosphor layer.

9. The stimulable phosphor sheet as claimed in claim 8, wherein the solid material is a polymer material.

10. The stimulable phosphor sheet as claimed in claim 8 or 9, wherein both sides of the stimulable phosphor sheet are protected by a polymer coating layer or a polymer film.

* * * * *